(12) United States Patent
Choong

(10) Patent No.: US 10,375,831 B2
(45) Date of Patent: Aug. 6, 2019

(54) STRETCHABLE MULTILAYER ELECTRONICS

(71) Applicant: Intel Corporation, Santa Clara, CA (US)

(72) Inventor: Chwee Lin Choong, Bayan Lepas (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/856,407

(22) Filed: Dec. 28, 2017

(65) Prior Publication Data

US 2019/0208640 A1  Jul. 4, 2019

(51) Int. Cl.
  *H05K 1/18* (2006.01)
  *H05K 1/02* (2006.01)
  *H05K 3/46* (2006.01)

(52) U.S. Cl.
  CPC ........... *H05K 1/189* (2013.01); *H05K 1/0283* (2013.01); *H05K 3/46* (2013.01); *H05K 2201/10106* (2013.01); *H05K 2201/10121* (2013.01); *H05K 2201/10151* (2013.01); *H05K 2203/061* (2013.01)

(58) Field of Classification Search
  CPC . H05K 2201/09418; H05K 2201/2072; H05K 2201/09263; H05K 2201/05; H05K 2201/09681; H05K 2201/0969; H05K 2201/097; H05K 1/0277; H05K 1/189; H05K 3/4691; H05K 3/4694; H05K 1/0283; H05K 1/0289
  See application file for complete search history.

(56) References Cited

U.S. PATENT DOCUMENTS

| | | | | |
|---|---|---|---|---|
| 5,445,869 | A | * 8/1995 | Ishikawa | H05K 1/028 428/209 |
| 2003/0222727 | A1 | * 12/2003 | McCurdy | H01P 3/02 333/1 |
| 2004/0192082 | A1 | * 9/2004 | Wagner | H05K 1/0283 439/67 |
| 2013/0322032 | A1 | * 12/2013 | Shigetaka | H05K 1/0277 361/749 |

* cited by examiner

*Primary Examiner* — Roshn K Varghese
(74) *Attorney, Agent, or Firm* — Schwegman Lundberg & Woessner, P.A.

(57) ABSTRACT

An electronic device may include a first flexible layer. The first flexible layer may include a first flexible substrate. The first flexible layer may include a first conductive layer. The first conductive layer may be coupled to the first flexible substrate. The electronic device may include a second flexible layer. The second flexible layer may be coupled to the first flexible layer. The second flexible layer may be coupled to the first flexible layer at a first distance. The second flexible layer may include a second flexible substrate. The second flexible layer may include a second conductive layer. The second conductive layer may be coupled to the second flexible substrate. The electronic device may include an elastomer foundation. The first flexible layer may include anchoring sites. The anchoring sites may be coupled to the elastomer foundation at a plurality of anchoring points.

13 Claims, 9 Drawing Sheets

STRETCHABLE MULTILAYER ELECTRONICS

BACKGROUND

Electronic components may be embedded in elastic substrates. The interconnections between electronic components may be configured to stretch.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventors have recognized, among other things, that a problem to be solved may include interconnecting multiple layers of electronic components in an elastic substrate. The present inventors have recognized, among other things, that another problem to be solved may include providing interconnections between electronic components that may withstand elastic deformations of the substrate that the electronic components are coupled to.

The present subject matter may help provide a solution to this problem, such as by providing an electronic device. The electronic device may include a first flexible layer. The first flexible layer may include a first flexible substrate. The first flexible layer may include a first conductive layer. The first conductive layer may be coupled to the first flexible substrate. The electronic device may include a second flexible layer. The second flexible layer may be coupled to the first flexible layer. The second flexible layer may be coupled to the first flexible layer at a first distance. The second flexible layer may include a second flexible substrate. The second flexible layer may include a second conductive layer. The second conductive layer may be coupled to the second flexible substrate. The electronic device may include an elastomer foundation. The first flexible layer may include anchoring sites. The anchoring sites may be coupled to the elastomer foundation at a plurality of anchoring points.

The present subject matter may help provide a solution to this problem, such as by coupling the anchor sites to the elastomer foundation at a plurality of anchoring points. Coupling the anchor sites to the elastomer foundation at a plurality of anchoring points may allow for the first flexible layer and the second flexible layer to withstand elastic deformations of the elastomer foundation, such as by allowing the first flexible layer and the second flexible layer to move in unison with the elastomer foundation.

This overview is intended to provide an overview of subject matter of the present patent application. It is not intended to provide an exclusive or exhaustive explanation of the invention.

Figure 1:
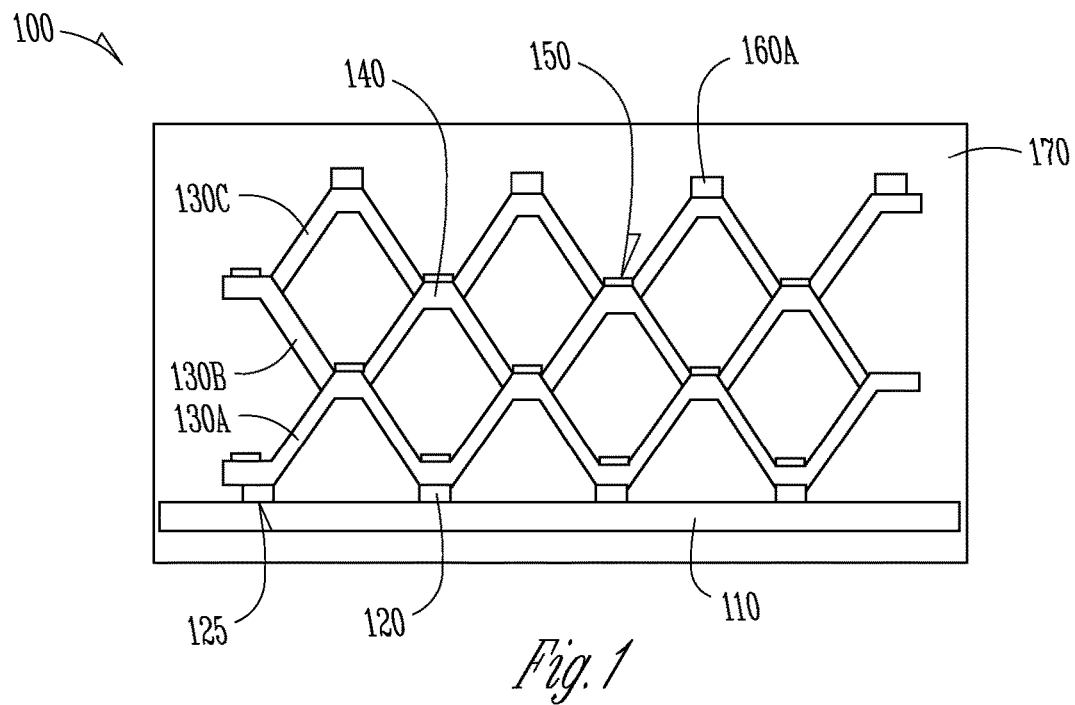
FIG. 1 illustrates a portion of an electronic device.

FIG. 1 illustrates a portion of an electronic device. 100. The electronic device 100 may include an elastomer foundation 110. The electronic device 100 may include anchoring sites 120. The electronic device 100 may include anchoring points 125. The electronic device 100 may include a first flexible layer 130A, a second flexible layer 130B, and/or a third flexible layer 130C. The electronic device 100 may include additional flexible layers. The anchoring sites 120 may be included in the first flexible layer 130A. The anchoring points 125 may be included in the elastomer foundation 110. The anchoring sites 120 may be coupled to the anchoring points 125. Coupling the anchoring sites 120 to the anchoring points 125 may couple the first flexible layer 130A with the elastomer foundation 110.

The electronic device 100 may include bonding sites 140. The bonding sites 140 may be stiffer than the elastomer foundation 110. The bonding sites 140 may have a durometer greater than a durometer of the elastomer foundation 110. The bonding sites 140 may be configured to couple the first flexible layer 130A with the second flexible layer 130B. Coupling the first flexible layer 130A with the second flexible layer 130B may increase the rigidity of the first flexible layer 130A and the second flexible layer 130B at the bonding sites 140.

The bonding sites 140 may be configured to couple the second flexible layer 130B with the third flexible layer 130C. The bonding sites 140 may be configured to couple the additional flexible layers to the third flexible layer 130C. The bonding sites 140 may space the first flexible layer 130A and the second flexible layer 130B at a first distance. The bonding sites 140 may space the first flexible layer 130A from the second flexible layer 130B at a second distance. The bonding sites 140 may space the second flexible layer 130B and the third flexible layer 130C at a third distance. The first distance may be the same as the second distance. The first distance may be different than the second distance. The first distance may be the same as the third distance. The first distance may be different than the third distance.

The electronic device 100 may include rigid islands 150. The rigid islands 150 may be formed by stiffening a portion of the first flexible layer 130A, the second flexible layer 130B, and/or the third flexible layer 130C. The rigid islands 150 may have a durometer greater than the elastomer foundation 110. Coupling the first flexible layer 130A with the second flexible layer 130B may create the rigid islands 150. The rigid islands 150 may provide a suitable foundation for the attachment of other elements. The rigid islands 150 may include electrical contact pads. The electrical contact pads may be utilized to interconnect (e.g., with soldering or wire-bonding) the first flexible layer 130A, the second flexible layer 130B, and/or the third flexible layer 130C with additional elements.

The electronic device 100 may include a first electronic component 160A. The first electronic component 160A may be coupled to the rigid islands 150. The rigid islands 150 may provide a suitable surface to mount the first electronic component 160A, such as by providing a rigid surface to couple with the first electronic component 160A.

The first electronic component 160A may be in electrical communication with the first flexible layer 130A, the second flexible layer 130B, and/or the third flexible layer 130C through the electrical contact pads. The first electronic component 160A may include a semiconductor, an integrated circuit, a passive component (e.g., a resistor, a capacitor, an inductor, a transformer, or a diode), a sensor, a light emitting diode, a photodiode, a photodetector, an optocoupler, an energy harvester, a MEMS, a battery, or the like.

The electronic device 100 may include an elastomeric overmold 170. The elastomeric overmold 170 may encapsulate the elastomer foundation 110, the first flexible layer 130A, the second flexible layer 130B, the third flexible layer 130C, the anchoring sites 120, the anchoring points 125, the bonding sites 140, the rigid islands 150, and/or the first electronic component 160A. The elastomeric overmold 170 may be formed upon the elastomer foundation 110. A seam may be detectable between the elastomer foundation 110 and the elastomeric overmold 170. The elastomeric overmold 170 may be a different material than the elastomer foundation 110.

Figure 2:
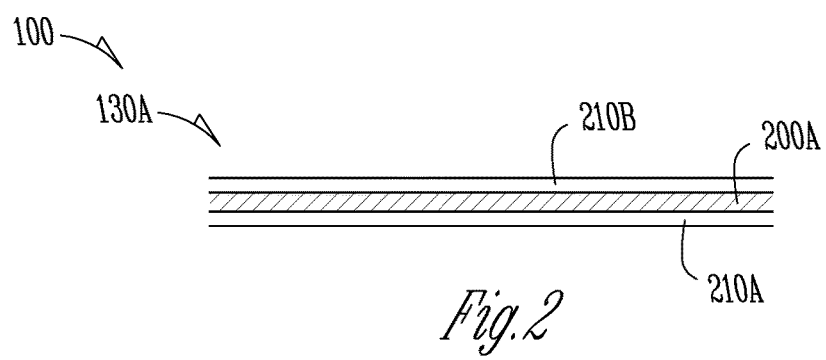
FIG. 2 illustrates another portion of the electronic device.

FIG. 2 illustrates another portion of the electronic device 100. The electronic device 100 may include the first flexible layer 130A. The first flexible layer 130A may include a first conductive layer 200A. The first flexible layer 130A may include a first flexible substrate 210A. The first flexible layer 130A may include a second flexible substrate 210B. The first conductive layer 200A may be coupled to the first flexible substrate 210A. The first conductive layer 200A may be coupled to the second flexible substrate 210B. The second flexible substrate 210B may be coupled to an opposite side of the first conductive layer 200A than the first flexible substrate 210A. The first flexible layer 210A or the second flexible layer 210B may improve the plasticity of the first conductive layer 200A. The first flexible layer 210A or the second flexible layer 210B may decrease the amount of fatigue experience by the first conductive layer 200A in response to cyclic loading of the first flexible layer 130A.

Additional flexible substrates may be coupled to the first conductive layer 200A. Additional flexible substrates may be coupled to the first flexible substrate 210A or the second flexible substrate 210B, such as to increase the rigidity or resilience of the first flexible substrate 210A or the second flexible substrate 210B. The additional flexible substrates may have the same durometer as the first flexible substrate 210A or the second flexible substrate 210B. The additional flexible substrates may have a durometer different than the first flexible substrate 210A or the second flexible substrate 210B.

Figure 3:
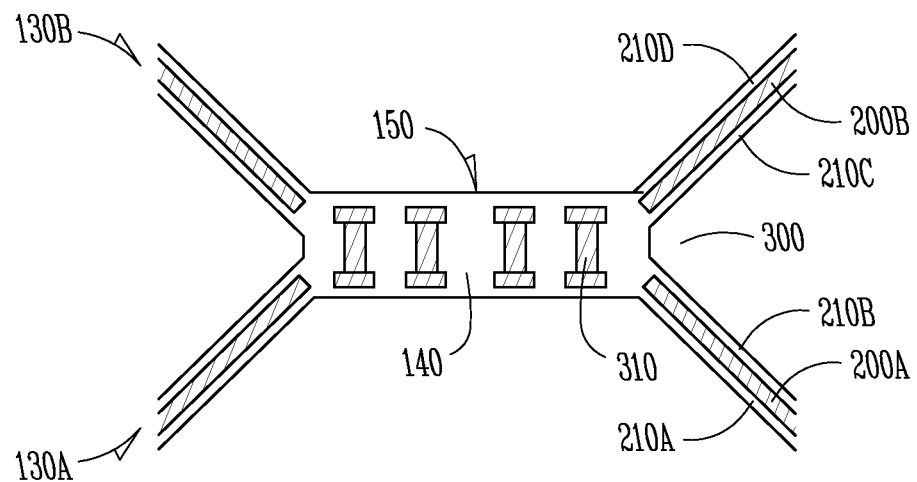
FIG. 3 illustrates yet another portion of the electronic device.

FIG. 3 illustrates yet another portion of the electronic device 100. The electronic device 100 may include the first flexible layer 130A. The electronic device 100 may include the second flexible layer 130B. The second flexible layer 130B may include a second conductive layer 200B. The second flexible layer 130B may include a third flexible substrate 210C. The second flexible layer 130B may include a fourth flexible substrate 210D. The electronic device 100 may include gaps 300. The gaps 300 may exist between portions of the first flexible layer 130A and the second flexible layer 130B. The gaps 300 may be located between the bonding sites 140. The gaps 300 may have the dimensions of the first distance, the second distance, or the third distance discussed with reference to FIG. 1.

The electronic device 100 may include one or more vias 310. The one or more vias 310 may be included in the bonding sites 140. The one or more vias 310 may provide one or more electrical communication pathways through the bonding sites 140. The one or more vias 310 may be in electrical communication with the first conductive layer 200A. The one or more vias 310 may be in electrical communication with the second conductive layer 200B. The one or more vias 310 may be configured to facilitate the electrical communication between the first conductive layer 130A and the second conductive layer 130B. The one or more vias 310 may be in electrical communication with the contact pads discussed with reference to FIG. 1.

The one or more vias 310 may include a metal plating. The one or more vias 310 may include conductive paste. The one or more vias 310 may include solder joints. An underfill material may surround the one or more vias 310. The underfill material may stiffen the bonding sites 140.

Figure 4:
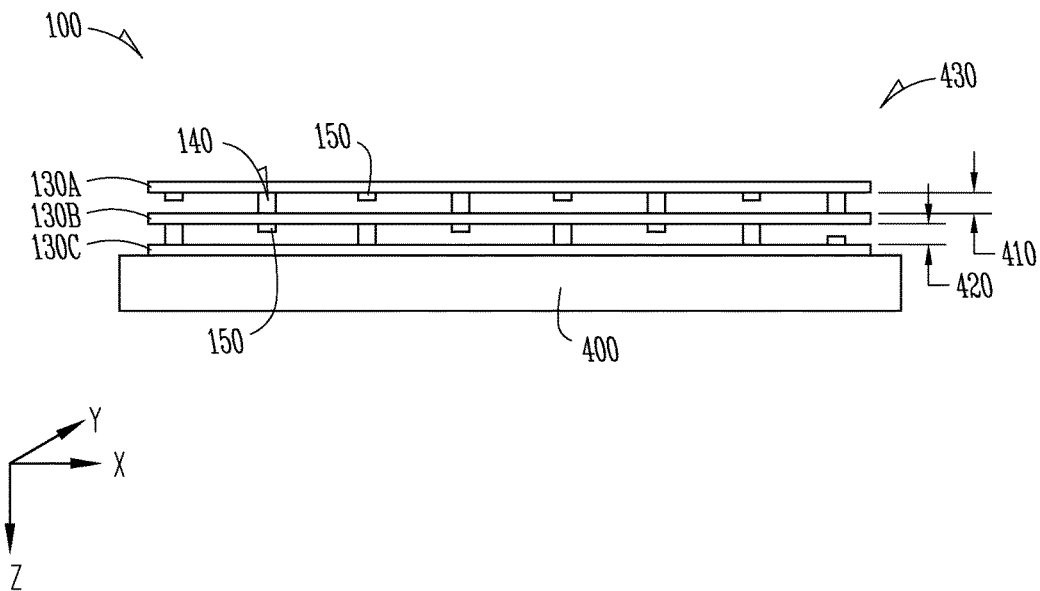
FIG. 4 illustrates the electronic device during a manufacturing operation.

FIG. 4 illustrates the electronic device 100 during a manufacturing operation. The electronic device 100 may be mated with a first carrier 400. A portion of the electronic device 100 may be mated with the first carrier 400. The first flexible layer 130A, the second flexible layer 130B, and/or the third flexible layer 130C may be mated with the first carrier 400. The first carrier 400 may provide a suitable foundation upon which to perform manufacturing operations upon the electronic device 100. Mating with the first carrier 400 may include applying an adhesive to a portion of the third flexible layer 130C. Mating with the first carrier 400 may include positioning the third flexible layer 130C in contact with the first carrier 400. Mating the third flexible layer 130C with the first carrier 400 may allow for the third flexible layer 130C to remain mated with the first carrier 400 despite movement or reorientation of the first carrier 400.

The second flexible layer 130B may be coupled to the third flexible layer 130C. The second flexible layer 130B may be coupled to the third flexible layer 130C at the second distance 420. The bonding sites 140 may space the second flexible layer 140B at the second distance 420 from the third flexible layer 130C. The second flexible layer 140B may be coupled to the third flexible layer 130C. The first flexible layer 140A may be coupled to the second flexible layer 130B at the first distance 410. The bonding sites 140 may space the first flexible layer 140A at the first distance 410 from the second flexible layer 130B.

The rigid islands 150 may be coupled to, or included in, the first flexible substrate 130A, the second flexible substrate 130B, and/or the third flexible substrate 130C at positions that are aligned with the bonding sites 140. The rigid islands 150 may be positioned on a first side of the first flexible substrate 130A, the second flexible substrate 130B, and/or the third flexible substrate 130C. The bonding sites 140 may be positioned on a second side of the first flexible substrate 130A, the second flexible substrate 130B, and/or the third flexible substrate 130C. The first side of the flexible substrates may be located opposite the second side of the flexible substrates.

The electronic device 100 may include one or more sets of flexible layers. The one or more sets of flexible layers may include a first set of flexible layers 430. The first set of flexible layers 430 may include the first flexible layer 130A and the second flexible layer 130B. The first set of flexible layers 430 may include the third flexible layer 130C. The first set of flexible layers 430 may include the additional flexible layers. The first set of flexible layers 430 may be manufactured as a modular, or standardized, unit. The modular unit may then be incorporated into further manufacturing operations. The one or more sets of flexible layers may be arranged to create structures. The one or more sets of flexible layers may be used to create grids, arrays, repeating unit cells, or the like.

Additional sets of flexible layers may be positioned adjacent to the first set of flexible layers 430 on the first carrier 400. Positioning the additional sets adjacent to the first set of flexible layers 430 may include stacking the additional sets on top of (e.g., along the Z-axis) the first set of flexible layers 430. Positioning the additional sets adjacent to the first set of flexible layers 430 may include aligning the additional sets in rows (e.g., along the Y-axis) along the first set of flexible layers 430. The rows may extend at an angle along the Y-axis from the first set of flexible layers 430. Positioning the additional sets adjacent to the first set of flexible layers 430 may include forming using the additional sets to form a continuous line (e.g., along the X-axis) with the first set of flexible layers 430. The additional sets of flexible layers may be positioned in any combination of the X-axis, Y-axis, and Z-axis (e.g., forming an angle with respect to the first set of flexible layers 430).

Figure 5:
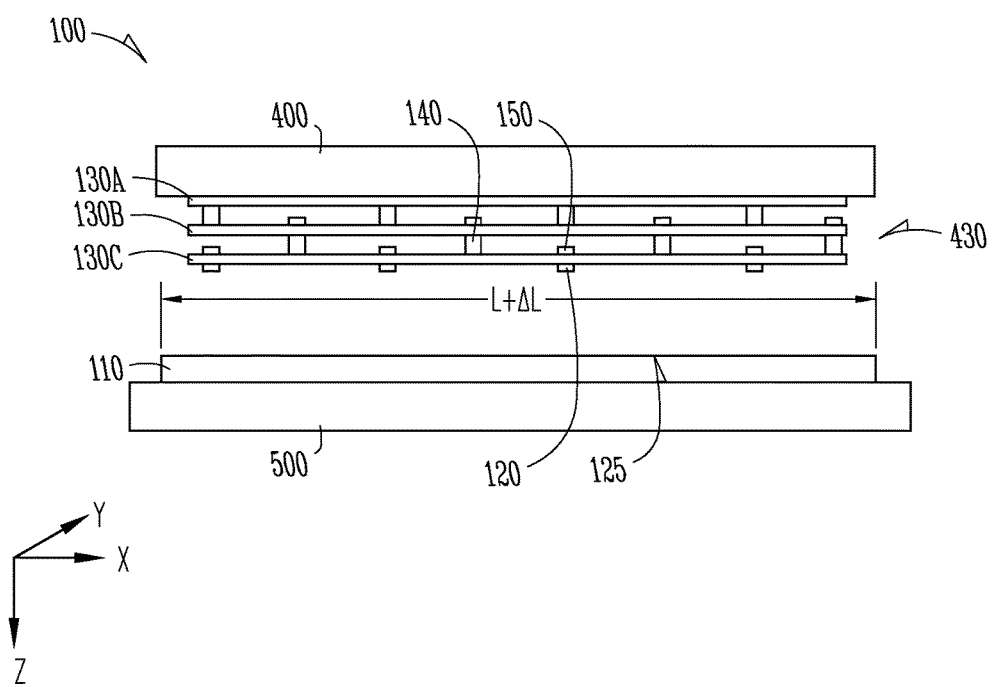
FIG. 5 illustrates the electronic device during another manufacturing operation.

FIG. 5 illustrates the electronic device 100 during another manufacturing operation. The electronic device 100 may include the elastomer foundation 110. The elastomer foundation 110 may be mated to the second carrier 500. The elastomer foundation 110 may have a first dimension L. The first dimension L may correspond to a length of the elastomer foundation 110 in an unstrained state (e.g., the at rest state of elastomer foundation 110). The elastomer foundation 110 may be strained (e.g., displaced, stretched, pulled, elongated, or the like) to a second dimension L+L.

The electronic device 100 may include the anchoring sites 120. The electronic device 100 may include the anchoring points 125. The anchoring points 125 may correspond in location to the location of the anchoring sites 120. The anchoring points 125 may be configured to have the same layout (e.g., dimensions, positions, quantity, or the like) as the anchoring sites 120.

The anchoring sites 120 may be coupled to the first flexible layer 130A. An adhesive material may be applied to the anchoring sites 120 or the anchoring points 125. The adhesive material may be applied to the first flexible layer 130A only at the anchoring sites 120. The adhesive may be a material configured to bond or otherwise couple the anchoring sites 120 to the anchoring points 125 of the elastomer foundation 110.

The first carrier 400 may be positioned proximate the second carrier 500. The first set of flexible layers 430 may be positioned proximate the elastomer foundation 110. The first flexible layer 130A may be positioned proximate the elastomer foundation 110. The anchoring sites 120 may be positioned proximate the anchoring points 125.

Figure 6:
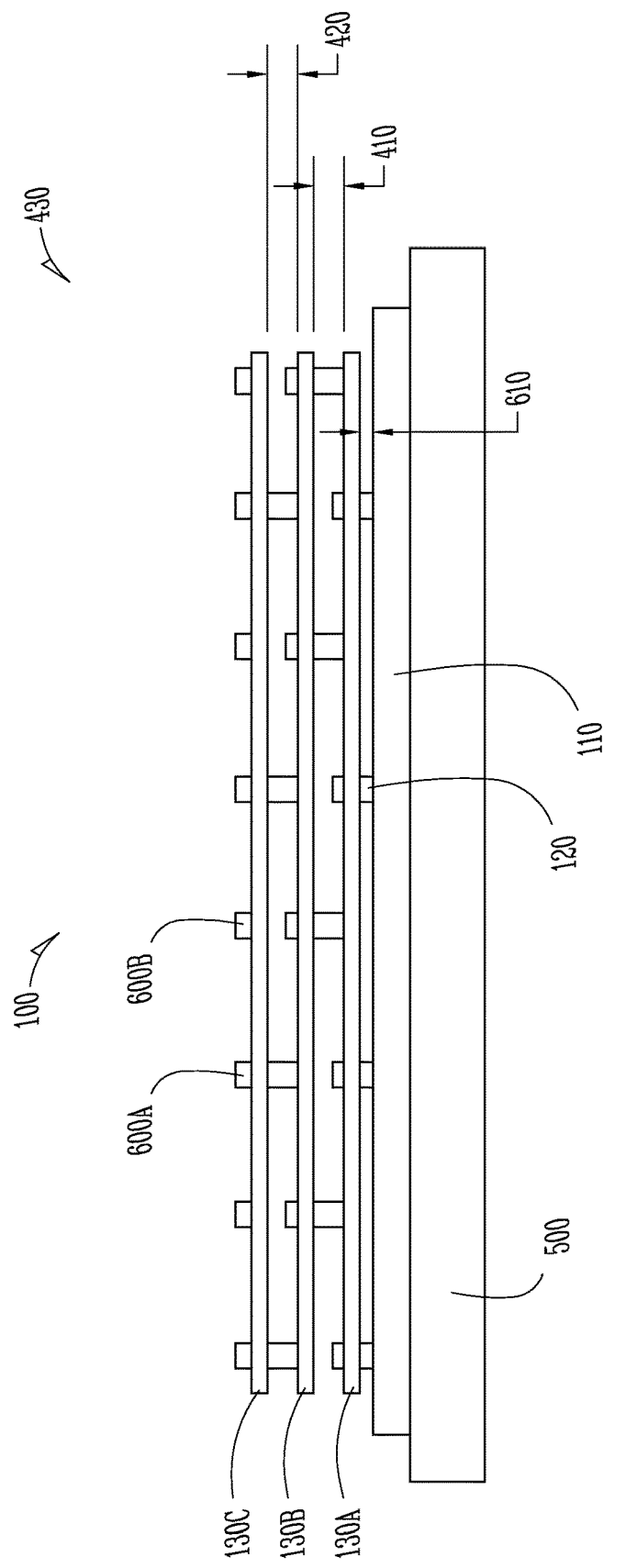
FIG. 6 illustrates the electronic device during yet another manufacturing operation.

FIG. 6 illustrates the electronic device 100 during yet another manufacturing operation. Coupling the anchoring sites 120 of the first flexible layer 130A with the anchoring points 125 of the elastomer foundation 110 may couple the first flexible layer 130A with the elastomer foundation 110. The first flexible layer 130A may be coupled with the elastomer foundation 110 when the elastomer foundation 110 is strained, such as when the elastomer foundation has the second dimension L+L. Coupling the anchoring sites 120 with the anchoring points 125 may couple the first set of flexible layers 430 to the elastomer foundation 110.

As discussed herein, the adhesive may be applied to the anchoring sites 120. The anchoring sites 120 may be mated with the anchoring points 125. The adhesive may be cured, causing the anchoring sites 120 to couple with the anchoring points 125. The anchoring sites 120 may be coupled to the anchoring points 125 using other manufacturing operations.

The first flexible layer 130A may be coupled to the elastomer foundation 110 at an anchoring distance 610. The anchoring distance 610 may be less than, equal to, or greater than the first distance 410 or the second distance 420. Coupling the first flexible layer 130A to the elastomer foundation 110 at the anchoring distance 610 may provide suspended segments of the first flexible layer 130A between the anchoring sites 120. The suspended segments of the first flexible layer 130B may not be coupled to the elastomer foundation 110. Coupling the second flexible layer 130B at the first distance 410 may provide suspended segments of the second flexible layer 130B between the bonding sites 140. The suspended segments of the second flexible layer 130B may not be coupled to the elastomer foundation 110.

The bonding sites 140 may be positioned on the first side of the flexible substrate 130A. The anchoring sites 120 may be positioned on the second side of the flexible substrate 130A. The bonding sites 140 may be positioned between the anchoring sites 120. The bonding sites 140 that couple the second flexible layer 130B with the first flexible layer 130A may be positioned between the anchoring sites 120 that couple the first flexible layer 130A with the elastomer foundation 110. The bonding sites 140 that couple the third flexible layer 130C with the second flexible layer 130B may be aligned with the anchoring sites 120 that couple the first flexible layer 130A with the elastomer foundation 110. The rigid islands 150 may be positioned on the first side of the flexible substrate 130A. The rigid islands 150 may be aligned with the anchoring sites 120 positioned on the second side of the flexible substrate 130A.

Figure 7:
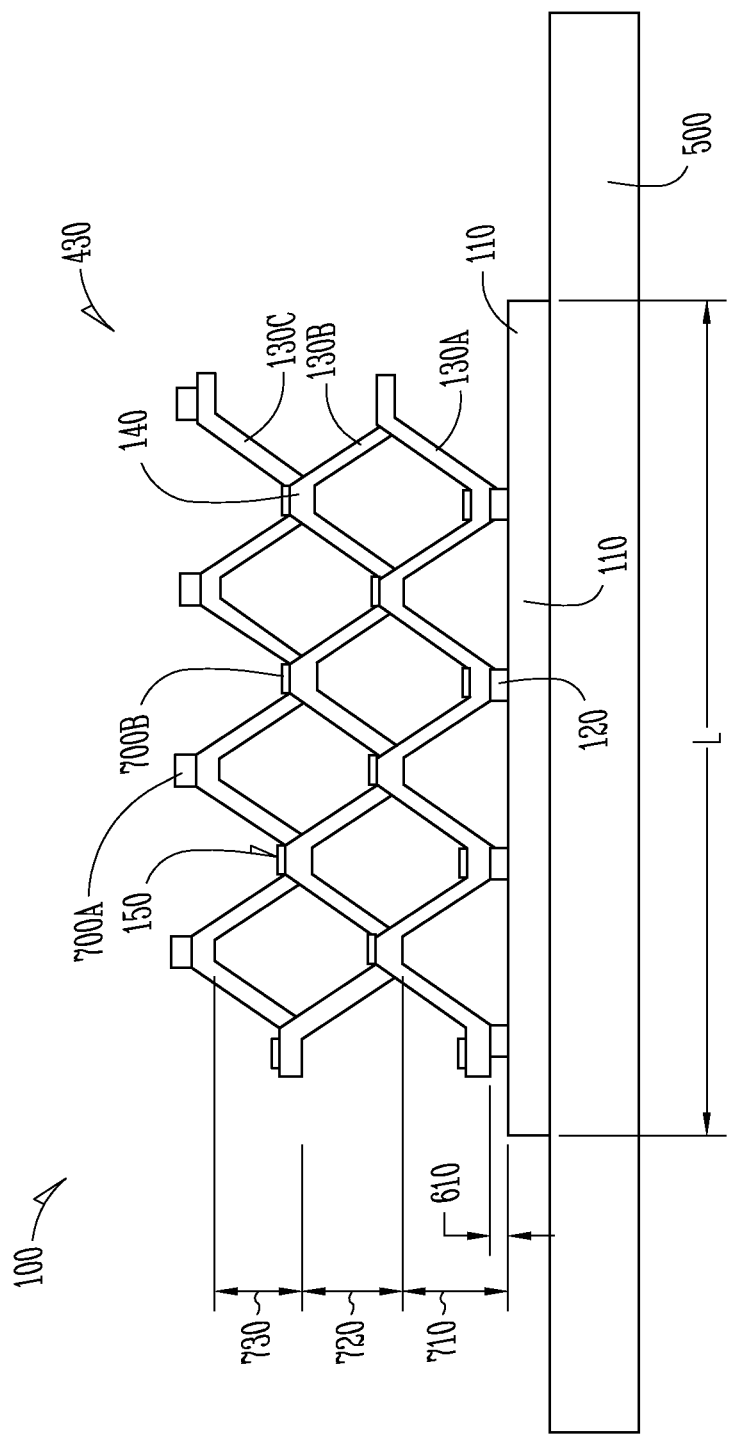
FIG. 7 illustrates the electronic device during still yet another manufacturing operation.

FIG. 7 illustrates the electronic device 100 during still yet another manufacturing operation. The first flexible layer 130A may be coupled to the elastomer foundation 110 when the elastomer foundation 110 is strained to the second dimension L+L. The elastomer foundation 110 may be relaxed (e.g., removing applied stresses) such that the elastomer foundation 110 returns to its unstrained state having the first dimension L.

Relaxing the elastomer foundation 110 may allow for a portion of the first flexible layer 130A (e.g., the suspended segments) between the anchoring sites 120 to be displaced (e.g., translate, buckle, bend, delaminate, or the like) with respect to the anchoring sites 120. Relaxing the elastomer foundation 110 may allow for a portion of the second flexible layer 130B between the bonding sites 140 to be displaced with respect to the bonding sites 140. Relaxing the elastomer foundation 110 may allow for a portion of the third flexible layer 130C between the bonding sites 140 to be displaced with respect to the bonding sites 140.

The portion of the first flexible layer 130A may be displaced to a first buckled height 710. The portion of the second flexible layer 130B may be displaced to a second buckled height 720. The first buckled height 710 may be the same as the second buckled height 720. The first buckled height 710 may be the same as the third buckled height 730. The first buckled height 710 may be different than the second buckled height 720. The first buckled height 710 may be different than the third buckled height 730. The first buckled height 710, the second buckled height 720, and/or the third buckled height 730 may be varied by changing the dimensions between the anchoring sites 120 or the bonding sites 140, respectively.

Displacement (e.g., straining) of the elastomer foundation 110 may cause a corresponding displacement of the anchoring sites 120. Displacement (e.g., straining) of the elastomer foundation 110 may cause a corresponding displacement of the bonding sites 140. The displacement of the elastomer foundation 110 may cause a substantially corresponding (e.g., within 10%) displacement of either the anchoring sites 120 or the bonding sites 140. The anchoring sites 120 may move in unison with the elastomer foundation 110. The bonding sites 140 may move in unison with the elastomer foundation 110.

As described herein, the elastomer foundation 110 may be displaced (e.g., stretched) from the first dimension L to the second dimension L+L (shown in FIG. 5), such that a length of the elastomer foundation is increased. As the elastomer foundation 110 is displaced, the anchoring sites 120 coupled to the elastomer foundation 110 may remain coupled to the elastomer foundation 110. The anchoring sites 120 may have a corresponding displacement to the elastomer foundation 110. The displacement of the elastomer foundation 110 may be accommodated by a translation (e.g., deflection), rotation, or combinations thereof, of the suspended segments of the first flexible layer 130A. The displacement of the suspended segments of the first flexible layer 130A may cause the first flexible layer 130A to straighten to the configuration shown in FIGS. 4-6.

The strain applied to the elastomer foundation 110 may result in the displacement of the suspended segments of the first flexible layer 130A. The displacement of the suspended segments may reduce the stresses and strains applied to the anchoring sites 120. The displacement of the suspended segments of the first flexible layer 130A may accommodate the displacement of the elastomer foundation 110 and allow for the anchoring sites 120 to remain coupled to the elastomer foundation 110. The displacement of the suspended segments of the first flexible layer 130A may improve the resilience of the coupling of the anchoring sites 120 to the elastomer foundation 110 because the anchoring sites 120 may experience negligible stresses and strains due to strains that are applied to the elastomer foundation 110. The strains that are applied to the elastomer foundation 110 may be absorbed by the displacement of the suspended segments and thereby allow for the anchoring sites 120, the bonding sites 140, and the rigid islands 150 to experience negligible stresses and strains when the elastomer foundation 110 is strained. Displacement of the suspended segments of the second flexible layer 130B may allow for the bonding sites 140 to have a corresponding displacement to the elastomer foundation 110.

Similarly, displacement of the elastomer foundation 110 may cause a displacement of the suspended segments of the second flexible layer 130B. The displacement of the first flexible layer 130A, coupled to the elastomer foundation 110, may cause the displacement of the second flexible layer 130B. The displacement of the second flexible layer 130B may cause a displacement of the third flexible layer 130C. The third flexible layer 130C and the second flexible layer 130B may be displaced an equal amount, or a substantially equal amount, as the first flexible layer 130A.

The elastomeric overmold 170 (shown in FIG. 1) may encapsulate portions of the electronic device 100. The elastomeric overmold 170 may encapsulate the first flexible layer 130A, the second flexible layer 130B, and the elastomer foundation 110. The elastomeric overmold 170 may be formed on the electronic device 100 when the elastomer foundation 110 has the first length. The elastomeric overmold 170 may be formed on the electronic device 100 when the elastomer foundation 110 is in an unstrained state. The elastomeric overmold 170 may be formed on the electronic device 100 when the first set of flexible layers 430 are displaced with respect to the anchoring sites 120. The elastomeric overmold 170 may add structural rigidity to the first set of flexible layers 430. The elastomeric overmold 170 may fill the gaps (e.g., the gap 300 of FIG. 3) between flexible layers (e.g., the first flexible layer 130A and the second flexible layer 130B). Displacement of the elastomeric overmold 170 may cause a corresponding displacement of the elastomer foundation 110. The elastomeric overmold 170 may move in unison with the elastomer foundation 110.

The electronic device 100 may include a first electronic component 700A. The electronic device 100 may include a second electronic component 700B. The first electronic component 700A or the second electronic component 700B may include the first electronic component 160A (shown in FIG. 1). The first electronic component 700A may be coupled to the rigid islands 150. The second electronic component 700B may be coupled to the rigid islands 150. The first electronic component 700A and the second electronic component 700B may both be coupled to an individual rigid island of the rigid islands 150. Additional electronic components may be coupled to the individual rigid island.

The plurality of flexible layers may provide a resilient interconnection between the first electronic component 700A and the second electronic component 700B, or other electrical components. The plurality of flexible layers 430 may allow for the electronic device 100 to be manipulated (e.g., have stresses and strains applied to the electronic device 100) without damaging the electronic device 100.

The first set of flexible layers 430 may include a plurality of electrically isolated channels. The first set of flexible layers 430 may facilitate the electrical communication between the first electronic component 700A and the second electronic component 700B. The first set of flexible layers 430 may facilitate the electrical communication between the first electronic component 700A and the second electronic component 700B, and between other electrical devices (e.g., additional sets of flexible layers or external electrical devices). The first electronic component 700A and the second electronic component 700B may each be in electrical communication with an individual bonding site of the bonding sites 140. The individual bonding site may be configured to send a signal to the first electronic component 700A and the second electronic component 700B. The individual bonding site may be configured to send the signal to the first electronic component 700A without sending the signal to the second electronic component 700B.

The first electronic component 700A may be coupled to an individual rigid island 150 on the first flexible layer 130A. The second electronic component 700B may be coupled to an individual rigid island 150 on the third flexible layer 130C. The first set of flexible layers 430 may facilitate the electrical communication between the first electronic component 700A and the second electronic component 700B through the intervening second flexible layer 130B.

Figure 8:
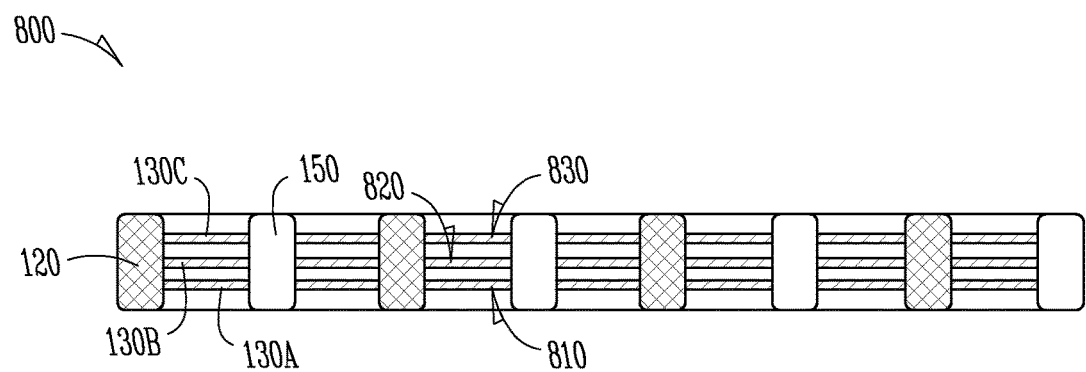
FIG. 8 illustrates a first electronic system.

FIG. 8 illustrates a first electronic system 800. In describing the first electronic system 800, reference is made to one or more components, features, functions and operations previously described herein. Where convenient, reference is made to the components, features, operations and the like with reference numerals. The reference numerals provided are exemplary and are not exclusive. For instance, components, features, functions, operations and the like described with respect to the first electronic system 800 include, but are not limited to, the corresponding numbered elements provided herein and other corresponding elements described herein (both numbered and unnumbered) as well as their equivalents.

The first electronic system 800 may include the first flexible layer 130A. The first electronic system 800 may include the second flexible layer 130B. The first electronic system 800 may include the third flexible layer 130C. The first flexible layer 130A may be included in a first set of flexible layers 810. The second flexible layer 130B may be included in a second set of flexible layers 820. The third flexible layer 130C may be included in a third set of flexible layers 830. The first set of flexible layers 810, second set of flexible layers 820, and/or the third set of flexible layers 830 may be configured similar to, or the same as, the first set of flexible layers 430. The anchoring sites 120 may be configured to couple the first set of flexible layers 810, second set of flexible layers 820, and/or the third set of flexible layers 830 with the elastomer foundation 110 (shown in FIGS. 1-7). The bonding sites 140 may be used to couple the first set of flexible layers 810, second set of flexible layers 820, and/or the third set of flexible layers 830 together.

The first system 800 may include coupling a plurality of the electronic devices 100 together. The first set of flexible layers 810, second set of flexible layers 820, and/or the third set of flexible layers 830 may be arranged in parallel rows. The first set of flexible layers 810, second set of flexible layers 820, and/or the third set of flexible layers 830 may be arranged to create structures. The first set of flexible layers 810, second set of flexible layers 820, and/or the third set of flexible layers 830 may be spaced apart. The first set of flexible layers 810, second set of flexible layers 820, and/or the third set of flexible layers 830 may be in electrical communication with each other, such as through the bonding sites 140.

As discussed herein, the flexible layers (e.g., the first flexible layer 130A) may be configured to be displaced in response to the straining of the elastomer foundation 110. The displacement of the first set of flexible layers 810 may mimic (e.g., mirror, correspond to, or substantially correspond to) the displacement of the second set of flexible layers 820, and/or the third set of flexible layers 830.

The first set of flexible layers 810 may include circuitry configured to perform a first function (e.g., store data). The second set of flexible layers 820 may be configured to perform a second function (e.g., process data). The third set of flexible layers 830 may be configured to perform a third function (e.g., determine the presence of a light source). The first set of flexible layers 810, second set of flexible layers 820, and/or the third set of flexible layers 830 may be interconnected.

Figure 9:
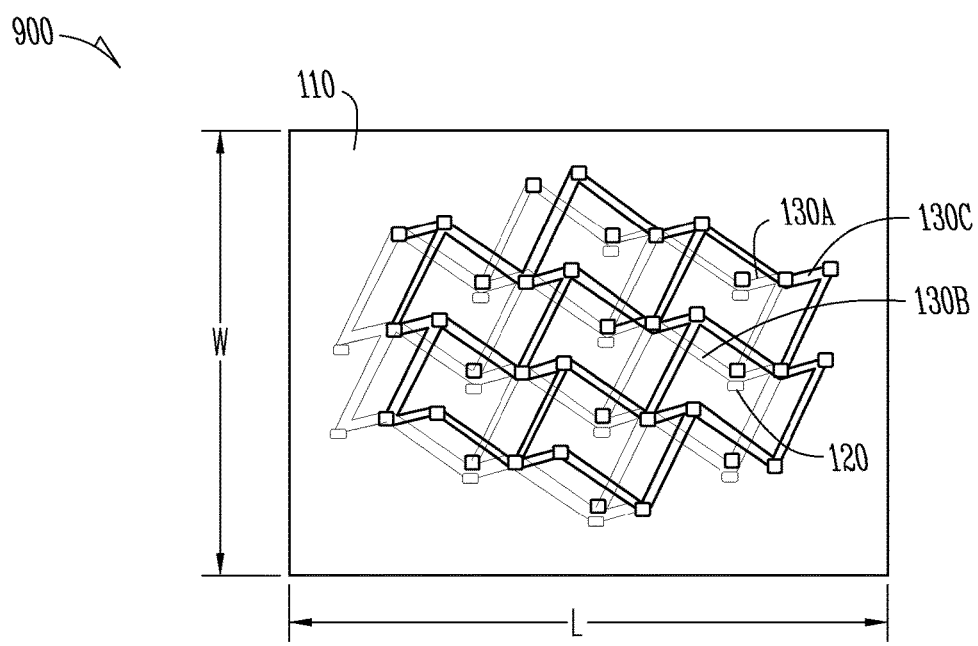
FIG. 9 illustrates a second electronic system in a first configuration.

FIG. 9 illustrates a second electronic system 900 in a first configuration. In describing the second electronic system 900, reference is made to one or more components, features, functions and operations previously described herein. Where convenient, reference is made to the components, features, operations and the like with reference numerals. The reference numerals provided are exemplary and are not exclusive. For instance, components, features, functions, operations and the like described with respect to the second electronic system 900 include, but are not limited to, the corresponding numbered elements provided herein and other corresponding elements described herein (both numbered and unnumbered) as well as their equivalents.

The second electronic system 900 is one example of a structure capable of being created with the electronic device 100. The electronic system 900 may include the first flexible layer 130A. The electronic system 900 may include the second flexible layer 130B. The electronic system 900 may include the third flexible layer 130C. The first flexible layer 130A and the second flexible layer 130B may be coupled to the elastomer foundation 110, such as by coupling the anchoring sites 120 to the elastomer foundation 110. The anchoring sites 120 of the first flexible layer 130A may be positioned at an angle with respect to the anchoring sites 120 of the second flexible layer 130B. A portion of the anchoring sites 120 of the first flexible layer 130A may be coextensive with (e.g., occupy the same space as) a portion of the anchoring sites 120 of the second flexible layer 130B.

The elastomer foundation 110 may have a length L. The elastomer foundation may have a width W. The elastomer foundation 110 may be configured to be strained in more than one direction. The elastomer foundation 110 may be strained along the width W and along the length L. The first configuration may include that the elastomer foundation 110 has the width W and the length L.

The second electronic system 900 may include the elastomeric overmold 170 (shown in FIG. 1). The elastomeric overmold 170 may be coupled to the elastomer foundation 110 when the elastomer foundation 110 is in a relaxed state (e.g., has the length L and the width W).

The second flexible layer 130B may be coupled to the first flexible layer 130A at the first distance. The third flexible layer 130C may be coupled to the first flexible layer 130A at the second distance. The second flexible layer 130B may extends in a first direction from the first flexible layer 130A. The third flexible layer 130C may extend in a second direction from the first flexible layer 130A. The second direction may be angled in relation to the first direction.

The first flexible layer 130A and the second flexible layer 130B may be included in a first level of flexible layers. The third flexible layer 130C may be included in a second level of flexible layers. The second electronic system 900 may be configured to include repeating structures (e.g., modules, unit cells, or the like). The repeating structures may be replicated and coupled together. The repeating structures may have geometric or irregular shapes.

Figure 10:
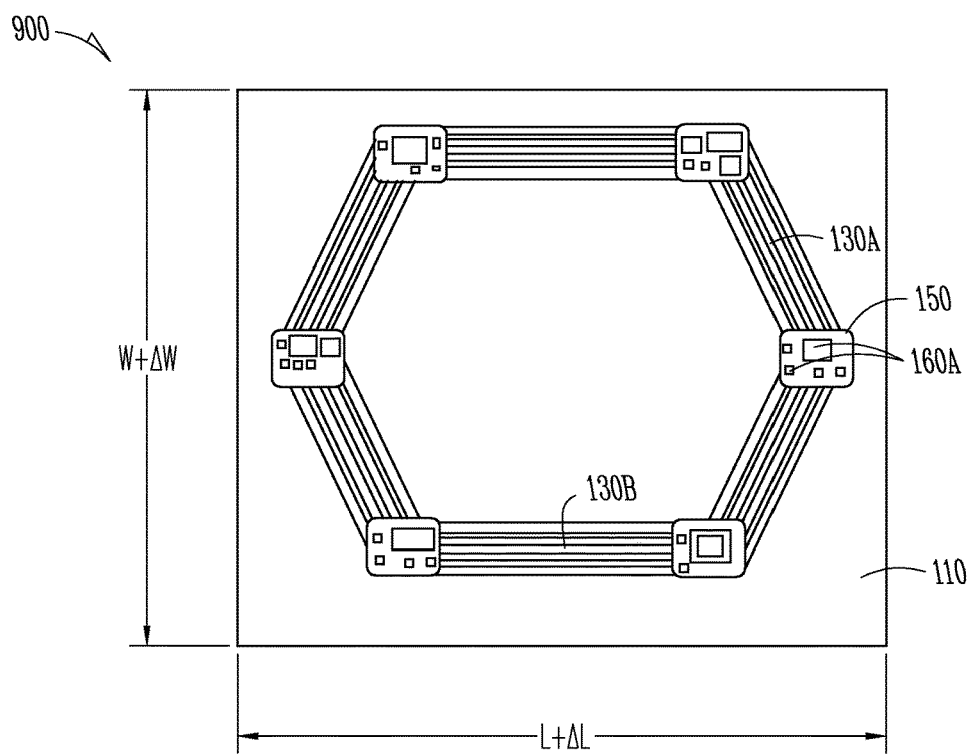
FIG. 10 illustrates a detailed view of the second electronic system in the first configuration.

FIG. 10 illustrates a detailed view of the second electronic system 900 in a second configuration. The first flexible layer 130A and the second flexible layer 130B may be coupled to the elastomer foundation 110, such as at the anchoring sites 120 (not shown). The first flexible layer 130A and the second flexible layer 130B may be coupled to the elastomer foundation 110 when the elastomer foundation is in a strained state. The elastomer foundation 110 may be in a strained state when the elastomer foundation 110 has a length L+L. The length L+L may be greater than the length L. The elastomer foundation 110 may be in a strained state when the elastomer foundation 110 has a width W+W. The width W+W may be greater than the width W.

The first flexible layer 130A and the second flexible layer 130B may be configured to be arranged in a geometric shape. The geometric shape may include circles, squares, rectangles, pentagons, hexagons, or the like. The first flexible layer 130A and the second flexible layer 130B may be arranged in the geometric shape when the elastomer foundation 110 is in a strained state.

The first flexible layer 130A may include a first set of anchoring sites. The second flexible layer 130B may include a second set of anchoring sites. The first set of anchoring sites and the second set of anchoring sites may be arranged in the geometric shape.

The first flexible layer 130A and the second flexible layer 130B may be configured to be arranged in irregular shapes. The first flexible layer 130A and the second flexible layer 130B may be arranged in the irregular shape when the elastomer foundation 110 is in an unstrained state. Additional flexible layers may be coupled to the first flexible layer 130A and/or the second flexible layer 130B to create the repeating structures. The repeating structures may be arranged to have the same shape as the first flexible layer 130A and the second flexible layer 130B.

The first flexible layer 130A and the second flexible layer 130B may include the rigid islands 150. The first electronic device 160A may be coupled to the rigid islands 150. The rigid islands 150 may be configured to couple with a plurality of electronic devices.

Figure 11:
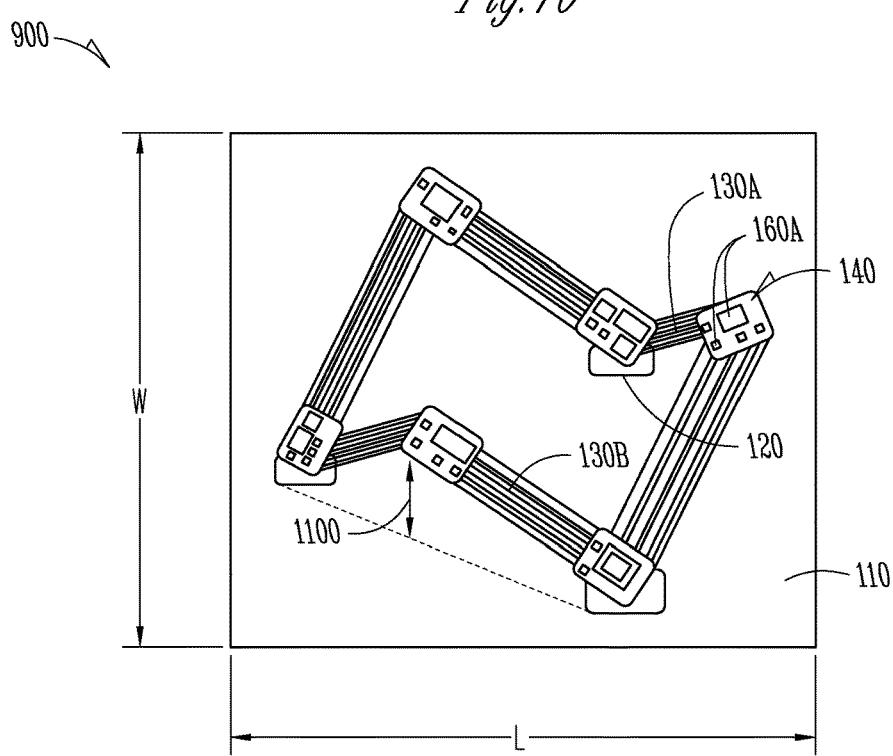
FIG. 11 illustrates a detailed view of the second electronic system in a second configuration.

FIG. 11 illustrates a detailed view of the second electronic system 900 in the first configuration. The elastomer foundation 110 may be allowed to relax. Relaxing the elastomer foundation 110 may cause the elastomer foundation 110 to have the length L. Relaxing the elastomer foundation 110 may cause the elastomer foundation 110 to have the width W. Relaxing the elastomer foundation may cause a portion of the first flexible layer 130A to deflect. Relaxing the elastomer foundation may cause a portion of the second flexible layer 130B to deflect. The second flexible layer 130B may deflect to a third buckled height 1100. The second flexible layer may deflect perpendicular to the elastomer foundation 110. The second flexible layer may deflect parallel to the elastomer foundation 110. The second flexible layer may deflect at an angle with respect to the elastomer foundation 110.

Figure 12:
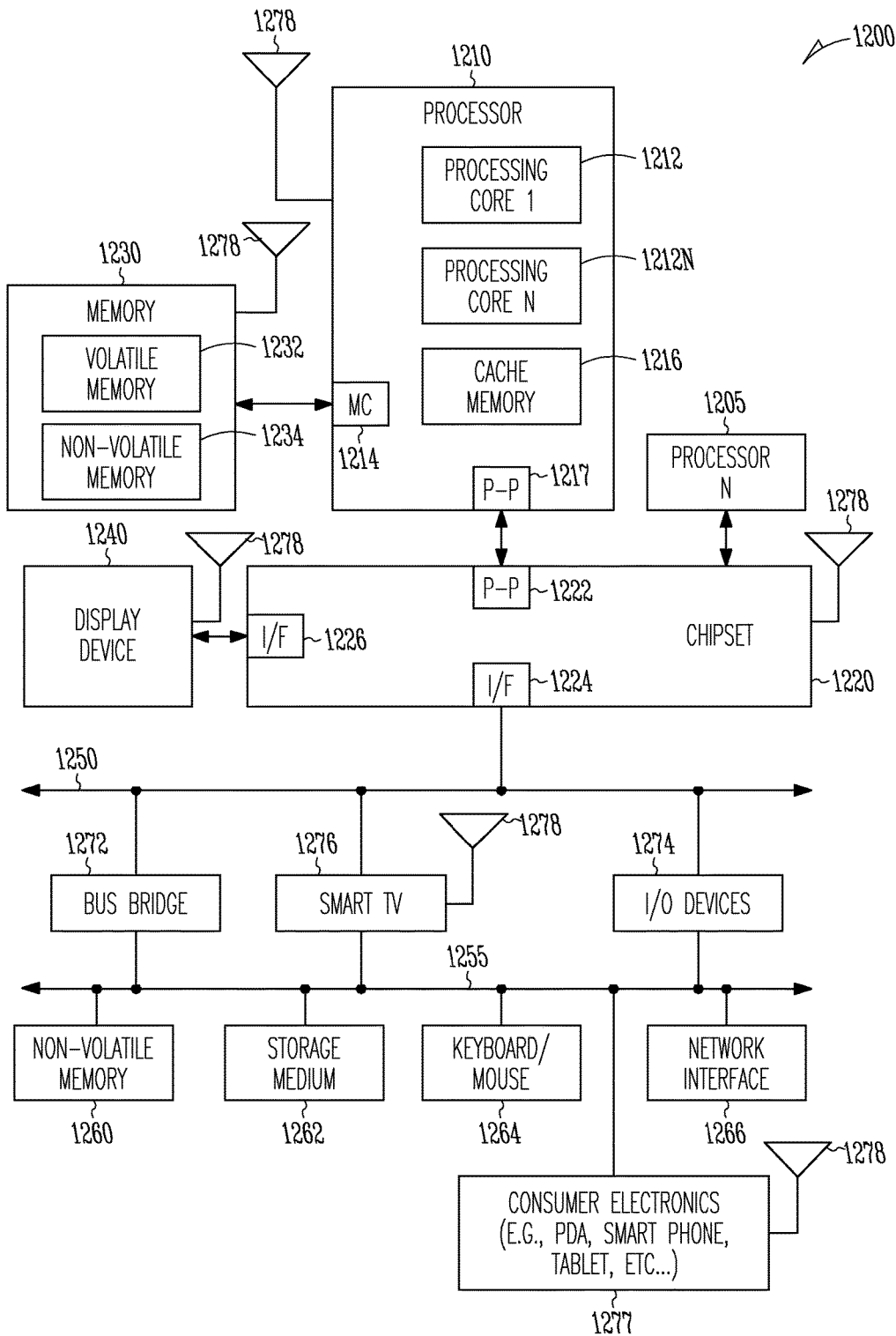
FIG. 12 illustrates a system level diagram, depicting an example of an electronic device (e.g., system) including the electronic device, the first electronic system, or the second electronic system as described in the present disclosure.

FIG. 12 illustrates a system level diagram, depicting an example of an electronic device (e.g., system) including the electronic device 100, the first electronic system 800, or the second electronic system 900 as described in the present disclosure. FIG. 12 is included to show an example of a higher level device application for the electronic device 100, the first electronic system 800, or the second electronic system 900. In one embodiment, system 1200 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 1200 is a system on a chip (SOC) system.

In one embodiment, processor 1210 has one or more processor cores 1212 and 1212N, where 1212N represents the Nth processor core inside processor 1210 where N is a positive integer. In one embodiment, system 1200 includes multiple processors including 1210 and 1205, where processor 1205 has logic similar or identical to the logic of processor 1210. In some embodiments, processing core 1212 includes, but is not limited to, pre-fetch logic to fetch instructions, decode logic to decode the instructions, execution logic to execute instructions and the like. In some embodiments, processor 1210 has a cache memory 1216 to cache instructions and/or data for system 1200. Cache memory 1216 may be organized into a hierarchal structure including one or more levels of cache memory.

In some embodiments, processor 1210 includes a memory controller 1214, which is operable to perform functions that enable the processor 1210 to access and communicate with memory 1230 that includes a volatile memory 1232 and/or a non-volatile memory 1234. In some embodiments, processor 1210 is coupled with memory 1230 and chipset 1220. Processor 1210 may also be coupled to a wireless antenna 1278 to communicate with any device configured to transmit and/or receive wireless signals. In one embodiment, an interface for wireless antenna 1278 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 1232 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 1234 includes, but is not limited to, flash memory, phase change memory (PCM), read-only memory (ROM), electrically erasable programmable read-only memory (EEPROM), or any other type of non-volatile memory device.

Memory 1230 stores information and instructions to be executed by processor 1210. In one embodiment, memory 1230 may also store temporary variables or other intermediate information while processor 1210 is executing instructions. In the illustrated embodiment, chipset 1220 connects with processor 1210 via Point-to-Point (PtP or P-P) interfaces 1217 and 1222. Chipset 1220 enables processor 1210 to connect to other elements in system 1200. In some embodiments of the example system, interfaces 1217 and 1222 operate in accordance with a PtP communication protocol such as the Intel® QuickPath Interconnect (QPI) or the like. In other embodiments, a different interconnect may be used.

In some embodiments, chipset 1220 is operable to communicate with processor 1210, 1205N, display device 1240, and other devices, including a bus bridge 1272, a smart TV 1276, I/O devices 1274, nonvolatile memory 1260, a storage medium (such as one or more mass storage devices) 1262, a keyboard/mouse 1264, a network interface 1266, and various forms of consumer electronics 1277 (such as a PDA, smart phone, tablet etc.), etc. In one embodiment, chipset 1220 couples with these devices through an interface 1224. Chipset 1220 may also be coupled to a wireless antenna 1278 to communicate with any device configured to transmit and/or receive wireless signals.

Chipset 1220 connects to display device 1240 via interface 1226. Display 1240 may be, for example, a liquid crystal display (LCD), a plasma display, cathode ray tube (CRT) display, or any other form of visual display device. In some embodiments of the example system, processor 1210 and chipset 1220 are merged into a single SOC. In addition, chipset 1220 connects to one or more buses 1250 and 1255 that interconnect various system elements, such as I/O devices 1274, nonvolatile memory 1260, storage medium 1262, a keyboard/mouse 1264, and network interface 1266. Buses 1250 and 1255 may be interconnected together via a bus bridge 1272.

In one embodiment, mass storage device 1262 includes, but is not limited to, a solid state drive, a hard disk drive, a universal serial bus flash memory drive, or any other form of computer data storage medium. In one embodiment, network interface 1266 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 12 are depicted as separate blocks within the system 1200, the functions performed by some of these blocks may be integrated within a single semiconductor circuit or may be implemented using two or more separate integrated circuits. For example, although cache memory 1216 is depicted as a separate block within processor 1210, cache memory 1216 (or selected aspects of 1216) may be incorporated into processor core 1212.

Figure 13:
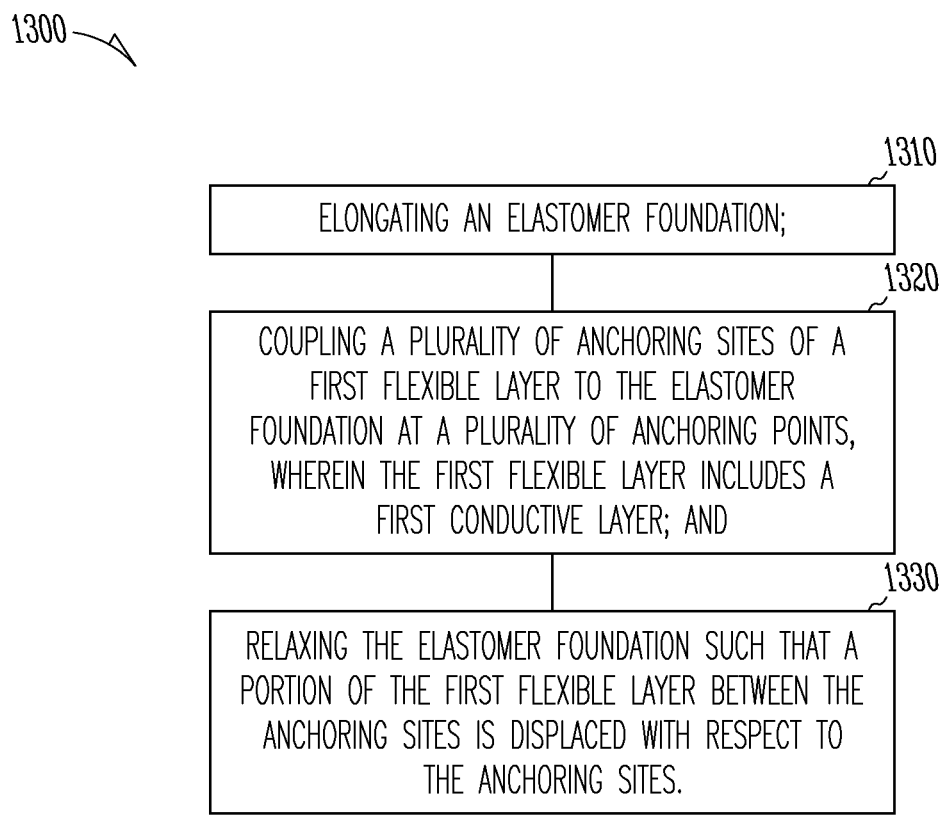
FIG. 13 illustrates a method for manufacturing the electronic device, the first electronic system 800, the second electronic system 900, or the third electronic system 1200.

FIG. 13 illustrates a method 1300 for manufacturing an electronic device, such as the electronic device 100, the first electronic system 800, the second electronic system 900, or the third electronic system 1200. In describing the method 1300, reference is made to one or more components, features, functions and operations previously described herein. Where convenient, reference is made to the components, features, operations and the like with reference numerals. The reference numerals provided are exemplary and are not exclusive. For instance, components, features, functions, operations and the like described with respect to the method 1300 include, but are not limited to, the corresponding numbered elements provided herein and other corresponding elements described herein (both numbered and unnumbered) as well as their equivalents.

The method 1300 may include at operation 1310 elongating an elastomer foundation (e.g., the elastomer foundation 110 of FIGS. 1, 5-7, and 9-11). The method 1300 may include at operation 1320 coupling a plurality of anchoring sites (e.g., the anchoring sites 120 of FIGS. 1, 5-9, and 11) of a first flexible layer (e.g., the first flexible layer 130A of FIGS. 1-11) to the elastomer foundation at a plurality of anchoring points (e.g., the anchoring points 125 of FIGS. 1 and 5). The first flexible layer may include a first conductive layer (e.g., the first conductive layer 200A of FIGS. 2 and 3).

The method 1300 may include at operation 1330 relaxing the elastomer foundation such that a portion of the first flexible layer between the anchoring sites is displaced with respect to the anchoring sites. The method 1300 may include coupling a second flexible layer (e.g., the second flexible layer 130B of FIGS. 1 and 3-11) to the first flexible layer at a plurality of bonding sites (e.g., the bonding sites 140 of FIGS. 1, 3-8). The second flexible layer may include a second conductive layer (e.g., the second conductive layer 200B of FIG. 3).

The method 1300 may also include that relaxing the elastomer foundation causes a portion of the second flexible layer to be displaced with respect to the bonding sites. The method 1300 may additionally include that the displacement of the portion of the second flexible layer is perpendicular to the elastomer foundation. The method 1300 may further include that the bonding sites are located between the anchoring sites.

The method 1300 may include coupling a rigid island (e.g., the rigid islands 150 of FIGS. 1 and 3-8) to the first flexible layer. The rigid island may have a durometer greater than the first flexible layer. The method 1300 may also include that the first flexible layer is parallel with the elastomer foundation when the anchoring sites are coupled to the anchoring points. The method 1300 may additionally include coupling the first flexible substrate to the first conductive layer and a second flexible substrate to the second conductive layer. The method 1300 may further include coupling a third flexible substrate to the first conductive layer on an opposite side from the first flexible substrate. The method 1300 may still further include coupling a fourth flexible substrate to the second conductive layer on an opposite side from the second flexible substrate.

The method 1300 may include that relaxing the elastomer foundation causes a corresponding displacement of the anchoring sites. The method 1300 may also include enclosing the first flexible layer and the elastomer foundation in an elastomeric overmold (e.g., the elastomeric overmold of FIG. 1). The method 1300 may also include that elongating the elastomer foundation may include elongating the elastomer foundation in a first direction and elongating the elastomer foundation in a second direction, wherein the first direction is at an angle with respect to the second direction.

VARIOUS NOTES AND EXAMPLES

Aspect 1 may include or use subject matter (such as an apparatus, a system, a device, a method, a means for performing acts, or a device readable medium including instructions that, when performed by the device, may cause the device to perform acts), such as may include or use an electronic device. The electronic device may include a first flexible layer. The first flexible layer may include a first flexible substrate. The first flexible layer may include a first conductive layer. The first conductive layer may be coupled to the first flexible substrate.

The electronic device may include a second flexible layer. The second flexible layer may be coupled to the first flexible layer. The second flexible layer may be coupled to the first flexible layer at a first distance. The second flexible layer may include a second flexible substrate. The second flexible layer may include a second conductive layer. The second conductive layer may be coupled to the second flexible substrate.

The electronic device may include an elastomer foundation. The first flexible layer may include anchoring sites. The anchoring sites may be coupled to the elastomer foundation at a plurality of anchoring points.

Aspect 2 may include or use, or may optionally be combined with the subject matter of Aspect 1, to optionally include or use that a portion of the first flexible layer between the anchoring sites may be displaced with respect to the anchoring sites.

Aspect 3 may include or use, or may optionally be combined with the subject matter of one or any combination of Aspects 1 or 2 to optionally include or use a plurality of bonding sites. The plurality of bonding sites may be configured to couple the first flexible layer with the second flexible layer. The bonding sites may space the first flexible layer and the second flexible layer at the first distance.

Aspect 4 may include or use, or may optionally be combined with the subject matter of one or any combination of Aspect 3 to optionally include or use that a portion of the second flexible layer between the bonding sites may be displaced with respect to the bonding sites.

Aspect 5 may include or use, or may optionally be combined with the subject matter of one or any combination of Aspects 1 through 4 to optionally include or use that the bonding sites may be positioned between the anchoring sites.

Aspect 6 may include or use, or may optionally be combined with the subject matter of one or any combination of Aspects 1 through 5 to optionally include or use that displacement of the elastomer foundation may cause a corresponding displacement of the bonding sites and the anchoring sites.

Aspect 7 may include or use, or may optionally be combined with the subject matter of one or any combination of Aspects 1 through 6 to optionally include or use a third flexible layer. The third flexible layer may be coupled to the first flexible layer. The third flexible layer may be coupled to the first flexible layer at a second distance. The second flexible layer may extend in a first direction from the first flexible layer. The third flexible layer may extend in a second direction from the first flexible layer. The second direction may be angled in relation to the first direction. The third flexible layer may include a third flexible substrate. The third flexible layer may include a third conductive layer. The third conductive layer may be coupled to the third flexible substrate.

Aspect 8 may include or use, or may optionally be combined with the subject matter of one or any combination of Aspects 1 through 7 to optionally include or use a third flexible substrate. The third flexible substrate may be coupled to the first conductive layer. The third flexible substrate may be coupled to an opposite side of the first conductive layer than the first flexible substrate.

Aspect 9 may include or use, or may optionally be combined with the subject matter of one or any combination of Aspects 1 through 8 to optionally include or use an elastomeric overmold. The elastomeric overmold may encapsulate the first flexible layer. The elastomeric overmold may encapsulate the second flexible layer. The elastomeric overmold may encapsulate the elastomer foundation.

Aspect 10 may include or use, or may optionally be combined with the subject matter of one or any combination of Aspect 9 to optionally include or use that the elastomeric overmold is a different material than the elastomer foundation.

Aspect 11 may include or use, or may optionally be combined with the subject matter of one or any combination of Aspects 1 through 10 to optionally include or use an electronic component. The electronic component may be coupled to the first flexible layer. The electronic component may be coupled to the second flexible layer.

Aspect 12 may include or use, or may optionally be combined with the subject matter of one or any combination of Aspect 11 to optionally include or use that the electronic component may include an integrated circuit, a passive component, a sensor, a light emitting diode, a photodiode, a photodetector, an opto-coupler, an energy harvester, or a MEMS.

Aspect 13 may include or use, or may optionally be combined with the subject matter of one or any combination of Aspects 1 through 12 to optionally include or use a rigid island. The rigid island may have a durometer greater than the elastomer foundation. An electronic component may be coupled to the rigid island.

Aspect 14 may include or use, or may optionally be combined with the subject matter of one or any combination of Aspects 1 through 13 to optionally include or use a via. The via may be configured to facilitate the electrical communication between the first conductive layer and the second conductive layer.

Aspect 15 may include or use subject matter (such as an apparatus, a system, a device, a method, a means for performing acts, or a device readable medium including instructions that, when performed by the device, may cause the device to perform acts), such as may include or use a method for manufacturing an electronic device. The method may include elongating an elastomer foundation. The method may include coupling a plurality of anchoring sites of a first flexible layer to the elastomer foundation at a plurality of anchoring points. The first flexible layer may include a first conductive layer. The method may include relaxing the elastomer foundation such that a portion of the first flexible layer between the anchoring sites may be displaced with respect to the anchoring sites.

Aspect 16 may include or use, or may optionally be combined with the subject matter of Aspect 15, to optionally include or use that the method includes coupling a second flexible layer to the first flexible layer at a plurality of bonding sites. The second flexible layer may include a second conductive layer.

Aspect 17 may include or use, or may optionally be combined with the subject matter of one or any combination of Aspect 16 to optionally include or use that relaxing the elastomer foundation may cause a portion of the second flexible layer to be displaced with respect to the bonding sites.

Aspect 18 may include or use, or may optionally be combined with the subject matter of one or any combination of Aspect 17 to optionally include or use that the displacement of the portion of the second flexible layer may be perpendicular to the elastomer foundation.

Aspect 19 may include or use, or may optionally be combined with the subject matter of one or any combination of Aspects 16 through 18 to optionally include or use that the bonding sites may be located between the anchoring sites.

Aspect 20 may include or use, or may optionally be combined with the subject matter of one or any combination of Aspects 15 through 19 to optionally include or use that the method includes coupling a rigid island to the first flexible layer. The rigid island may have a durometer greater than the first flexible layer.

Aspect 21 may include or use, or may optionally be combined with the subject matter of one or any combination of Aspects 15 through 20 to optionally include or use that the first flexible layer may be parallel with the elastomer foundation when the anchoring sites are coupled to the anchoring points.

Aspect 22 may include or use, or may optionally be combined with the subject matter of one or any combination of Aspects 15 through 21 to optionally include or use that the method may include coupling the first flexible substrate to the first conductive layer. The method may include coupling a second flexible substrate to the second conductive layer.

Aspect 23 may include or use, or may optionally be combined with the subject matter of one or any combination of Aspect 22 to optionally include or use that the method may include coupling a third flexible substrate to the first conductive layer. The third flexible substrate may be coupled to the first conductive layer on an opposite side from the first flexible substrate. The method may include coupling a fourth flexible substrate to the second conductive layer. The fourth flexible substrate may be coupled to the second conductive layer on an opposite side from the second flexible substrate.

Aspect 24 may include or use, or may optionally be combined with the subject matter of one or any combination of Aspects 15 through 23 to optionally include or use that relaxing the elastomer foundation may cause a corresponding displacement of the anchoring sites.

Aspect 25 may include or use, or may optionally be combined with the subject matter of one or any combination of Aspects 15 through 24 to optionally include or use that the method may include enclosing the first flexible layer in an elastomeric overmold. The method may include enclosing the elastomer foundation in the elastomeric overmold.

Aspect 26 may include or use, or may optionally be combined with the subject matter of one or any combination of Aspects 15 through 25 to optionally include or use that elongating the elastomer foundation may include elongating the elastomer foundation in a first direction. The method may include elongating the elastomer foundation in a second direction. The first direction may be at an angle with respect to the second direction.

Aspect 27 may include or use subject matter (such as an apparatus, a system, a device, a method, a means for performing acts, or a device readable medium including instructions that, when performed by the device, may cause the device to perform acts), such as may include or use a first set of flexible layers. The first set of flexible layers may include a first flexible layer. The first flexible layer may include a first flexible substrate. The first flexible layer may include a first conductive layer. The first conductive layer may be coupled to the first flexible substrate.

The first set of flexible layers may include a second flexible layer coupled to the first flexible layer at a first distance, the second flexible layer including a second flexible substrate and a second conductive layer coupled to the second flexible substrate;

The electronic device may include a second set of flexible layers. The second set of flexible layers may include a third flexible layer. The third flexible layer may include a third flexible substrate. The third flexible layer may include a third conductive layer. The third conductive layer may be coupled to the first flexible substrate.

The second set of flexible layers may include a fourth flexible layer. The fourth flexible layer may be coupled to the third flexible layer. The fourth flexible layer may be coupled to the third flexible layer at a second distance. The second flexible layer may include a fourth flexible substrate. The second flexible layer may include a fourth conductive layer. The fourth conductive layer may be coupled to the fourth flexible substrate.

The electronic device may include an elastomer foundation. The first flexible layer may include a first set of anchoring sites. The third flexible layer may include a second set of anchoring sites. The first set of anchoring sites may be coupled to the elastomer foundation at a plurality of anchoring points. The second set of anchoring sites may be coupled to the elastomer foundation at the plurality of anchoring points.

Aspect 28 may include or use, or may optionally be combined with the subject matter of Aspect 27, to optionally include or use that the first set of anchoring sites may be positioned at an angle with respect to the second set of anchoring sites.

Aspect 29 may include or use, or may optionally be combined with the subject matter of one or any combination of Aspects 27 or 29 to optionally include or use that a portion of the first set of anchoring sites may be coextensive with a portion of the second set of anchoring sites.

Aspect 30 may include or use, or may optionally be combined with the subject matter of one or any combination of Aspects 27 through 29 to optionally include or use that the first set of anchoring sites and the second set of anchoring sites may be arranged in a geometric shape.

Aspect 31 may include or use, or may optionally be combined with the subject matter of one or any combination of Aspects 27 through 30 to optionally include or use that a portion of the first flexible layer between the first set of anchoring sites may be displaced with respect to the first set of anchoring sites.

Aspect 32 may include or use, or may optionally be combined with the subject matter of one or any combination of Aspect 31 to optionally include or use that a portion of the third flexible layer between the second set of anchoring sites may be displaced with respect to the second set of anchoring sites. The displacement of the portion of the third flexible sites may mimic the displacement of the portion of the first flexible layer.

Aspect 33 may include or use, or may optionally be combined with the subject matter of one or any combination of Aspects 31 through 32 to optionally include or use that the portion of the first flexible layer between the first set of anchoring sites may be displaced perpendicular to the elastomer foundation.

Each of these non-limiting examples may stand on its own, or may be combined in various permutations or combinations with one or more of the other examples.

The above description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. An electronic device, comprising: a first flexible layer, including a first flexible substrate and a first conductive layer coupled to the first flexible substrate; a second flexible layer including a second flexible substrate and a second conductive layer coupled to the second flexible substrate, wherein a first gap is located between the first flexible layer and the second flexible layer, and a plurality of bonding sites extend between the first flexible layer and the second flexible layer, and the plurality of bonding sites extend through the first gap, the plurality of bonding sites couple the first flexible layer with the second flexible layer; an elastomer foundation; and wherein the first flexible layer includes anchoring sites and the anchoring sites are coupled to the elastomer foundation at a plurality of anchoring points, further comprising a third flexible layer coupled to the first flexible layer and the third flexible layer is spaced apart from the third flexible layer with a second gap, the third flexible layer including: a third flexible substrate, and a third conductive layer coupled to the third flexible substrate; and wherein the second flexible layer is coupled with the first flexible layer and extends in a first direction, and the third flexible layer is coupled with the first flexible layer and extends in a second direction, and the second direction is angled in relation to the first direction, further comprising a rigid island, wherein the rigid island has a durometer greater than the elastomer foundation, and an electronic component is coupled to the rigid island.

2. The electronic device of claim 1, wherein a portion of the first flexible layer between the anchoring sites is displaced with respect to the anchoring sites.

3. The electronic device of claim 1, wherein the first flexible layer is in electrical communication with the second flexible layer through one or more of the plurality of bonding sites.

4. The electronic device of claim 1, wherein a portion of the second flexible layer between the bonding sites is displaced with respect to the bonding sites.

5. The electronic device of claim 1, wherein displacement of the elastomer foundation causes a corresponding displacement of the bonding sites and the anchoring sites.

6. The electronic device of claim 1, further comprising an elastomeric overmold encapsulating the first flexible layer, the second flexible layer, and the elastomer foundation.

7. The electronic device of claim 1, further comprising an electronic component coupled to either the first flexible layer, or the second flexible layer.

8. The electronic device of claim 1, wherein the electronic component includes an integrated circuit, a passive component, a sensor, a light emitting diode, a photodiode, a photodetector, an opto-coupler, an energy harvester, or a MEMS.

9. An electronic device, comprising: a first set of flexible layers, including: a first flexible layer, including a first flexible substrate and a first conductive layer coupled to the first flexible substrate; a second flexible layer coupled to the first flexible layer at a first distance, the second flexible layer including a second flexible substrate and a second conductive layer coupled to the second flexible substrate; a second set of flexible layers, including: a third flexible layer, including a third flexible substrate and a third conductive layer coupled to the first flexible substrate; a fourth flexible layer coupled to the third flexible layer at a second distance, the fourth flexible layer including a fourth flexible substrate and a fourth conductive layer coupled to the fourth flexible substrate; an elastomer foundation; wherein the first flexible layer includes a first set of anchoring sites, the third flexible layer includes a second set of anchoring sites, and the first set of anchoring sites and the second set of anchoring sites are coupled to the elastomer foundation at a plurality of anchoring points; wherein a first gap is located between the first flexible layer and the second flexible layer, and a first set of bonding sites extend between the first flexible layer and the second flexible layer, and the first set of bonding sites extend through the first gap, the first set of bonding sites couple the first flexible layer with the second flexible layer; and wherein a second gap is located between the second flexible layer and the fourth flexible layer, and a second set of bonding sites extend between the second flexible layer and the fourth flexible layer, and the second set bonding sites extend through the second gap, the second set of bonding sites couple the second flexible layer with the fourth flexible layer, further comprising a rigid island, wherein the rigid island has a durometer greater than the elastomer foundation, and an electronic component is coupled to the rigid island.

10. The electronic device of claim 9, wherein the first set of anchoring sites are positioned at an angle with respect to the second set of anchoring sites.

11. The electronic device of claim 9, wherein a portion of the first set of anchoring sites are coextensive with a portion of the second set of anchoring sites.

12. The electronic device of claim 9, wherein a portion of the first flexible layer between the first set of anchoring sites is displaced with respect to the first set of anchoring sites.

13. The electronic device of claim 12, wherein the portion of the first flexible layer between the first set of anchoring sites is displaced perpendicular to the elastomer foundation.

\* \* \* \* \*